United States Patent
Gandelhman et al.

(10) Patent No.: US 9,731,964 B2
(45) Date of Patent: Aug. 15, 2017

(54) MICROMECHANICAL COMPONENT WITH A REDUCED CONTACT SURFACE AND ITS FABRICATION METHOD

(71) Applicant: Nivarox-FAR S.A., Le Locle (CH)

(72) Inventors: Alex Gandelhman, Neuchatel (CH); Andre Pin, Le Landeron (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 15/171,002

(22) Filed: Jun. 2, 2016

(65) Prior Publication Data
US 2016/0376147 A1    Dec. 29, 2016

(30) Foreign Application Priority Data

Jun. 25, 2015  (EP) .................................... 15173825

(51) Int. Cl.
*B81C 1/00* (2006.01)
*G04D 99/00* (2006.01)
*G04B 13/02* (2006.01)

(52) U.S. Cl.
CPC ...... *B81C 1/00619* (2013.01); *B81C 1/00103* (2013.01); *G04B 13/026* (2013.01); *G04D 99/00* (2013.01); *B81B 2201/035* (2013.01); *B81B 2203/0384* (2013.01); *B81C 2201/014* (2013.01); *B81C 2201/0112* (2013.01); *B81C 2201/0132* (2013.01); *B81C 2201/0138* (2013.01); *B81C 2201/0188* (2013.01); *B81C 2201/0198* (2013.01)

(58) Field of Classification Search
CPC ...... G04B 13/02; G04B 13/026; G04D 99/00; B81C 1/00103; B81C 1/00619; B81C 2201/0132; B81C 2201/0138; B81C 2201/014; B81C 2201/0112; B81C 2201/0188; B81C 2201/0198; B81B 2201/035; B81B 2203/0384

See application file for complete search history.

(56) References Cited

U.S. PATENT DOCUMENTS

| | | | |
|---|---|---|---|
| 6,150,275 A | 11/2000 | Cho et al. | |
| 6,406,636 B1 | 6/2002 | Vaganov | |
| 8,664,562 B2 * | 3/2014 | Watkins | B23K 26/03 219/121.62 |
| 8,739,385 B2 * | 6/2014 | Verardo | G04B 13/02 29/520 |

(Continued)

FOREIGN PATENT DOCUMENTS

| | | |
|---|---|---|
| CH | 699 476 A2 | 3/2010 |
| EP | 2 735 540 A1 | 5/2014 |
| EP | 2 840 059 A1 | 2/2015 |

OTHER PUBLICATIONS

European Search Report issued Nov. 30, 2015 in European Application 15 173825, filed Jun. 25, 2015 (with English Translation).

*Primary Examiner* — Vit W Miska
(74) *Attorney, Agent, or Firm* — Oblon, McClelland, Maier & Neustadt, L.L.P.

(57) ABSTRACT

The invention relates to a silicon-based component with at least one reduced contact surface which, formed from a method combining at least one oblique side wall etching step with a "Bosch" etch of vertical side walls, improves, in particular, the tribology of components formed by micromachining a silicon-based wafer.

8 Claims, 5 Drawing Sheets

(56) References Cited

U.S. PATENT DOCUMENTS

| | | | | |
|---|---|---|---|---|
| 2003/0012509 A1* | 1/2003 | Chang | .................... | G02B 6/266 |
| | | | | 385/50 |
| 2003/0027370 A1* | 2/2003 | Helin | ................... | G02B 6/3584 |
| | | | | 438/50 |
| 2005/0126917 A1* | 6/2005 | Morimoto | ............ | G04D 3/0092 |
| | | | | 205/50 |
| 2010/0054089 A1* | 3/2010 | Maier | ................. | B81C 99/0085 |
| | | | | 368/169 |
| 2013/0309446 A1* | 11/2013 | Conus | ................. | G04B 13/022 |
| | | | | 428/135 |

* cited by examiner

A

B

C

D

E

MICROMECHANICAL COMPONENT WITH A REDUCED CONTACT SURFACE AND ITS FABRICATION METHOD

This application claims priority from European Patent Application No. 15173825.9 filed on Jun. 25, 2015, the entire disclosure of which is hereby incorporated by reference.

FIELD OF THE INVENTION

The invention relates to micromechanical component with a reduced contact surface and a method for fabrication of the same. More specifically, the invention relates to such a component formed by micromachining a wafer of material.

BACKGROUND OF THE INVENTION

CH Patent 698837 discloses the fabrication of a timepiece component by micromachining a water of amorphous or crystalline material, such as crystalline or polycrystalline silicon.

Such micromachining is generally obtained by deep reactive ion etching (also known by the abbreviation "DRIE"). As illustrated in FIGS. 1 to 3, a known micromachining method consists in structuring a mask 1 on a substrate 3 (cf. FIG. 1, step A) followed by a "Bosch" deep reactive ion etching combining in succession an etching phase (cf. FIG. 1, steps B, D, E) followed by a passivation phase (cf. FIG. 1, step C, layer 4) in order to obtain from the pattern of mask 1, an anisotropic, i.e. substantially vertical, etch 5, in the wafer (cf. FIG. 2).

As illustrated in FIG. 3, an example of a "Bosch" deep reactive ion etching is shown with, in solid lines, the flow of $SF_6$ in sccm as a function of time in seconds, for etching a silicon wafer and, in dotted lines, the flow of $C_4F_8$ in sccm as a function of time in seconds, for the passivation, i.e. the protection, of the silicon wafer. It is thus clearly seen that the phases are strictly consecutive and each have a specific flow and time.

In the example of FIG. 3, there is shown a first etching phase $G_1$, with a flow of $SF_6$ at 300 sccm for 7 seconds, followed by a first passivation phase $P_1$ with a flow of $C_4F_8$ at 200 sccm for 2 seconds, followed by a second etching phase $G_2$ with a flow of $SF_6$ at 300 sccm for 7 seconds again, and finally, followed by a second passivation phase $P_2$ with a flow of $C_4F_8$ at 200 sccm for 2 seconds again, and so on. It is thus noted that a certain number of parameters enable the "Bosch" deep reactive ion etch process to be varied to obtain more or less marked scalloping in the wall of vertical etch 5.

After several years of fabrication, it was found that these vertical etches 5 were not entirely satisfactory, particularly as regards tribology.

SUMMARY OF THE INVENTION

It is an object of the present invention to overcome all or part of the aforecited drawbacks by proposing a new type of micromechanical component and a new type of fabrication method making it possible to improve the tribology of components formed by micromachining a wafer of material.

The invention therefore relates to a method for fabricating a silicon-based micromechanical component including the following steps:
  a) taking a silicon-based substrate;
  b) forming a mask pierced with holes on a horizontal portion of the substrate;
  c) etching, in an etching chamber, substantially vertical walls, in a part of the thickness of the substrate from holes of the mask, in order to form peripheral walls of the micromechanical component;
  d) forming a protective layer on the vertical walls, leaving the bottom of the etch made in step c) without any protective layer;
  e) etching, in the etching chamber, predetermined oblique walls, in the remaining thickness of the substrate from the bottom, which has no protective layer, in order to form oblique lower surfaces beneath the peripheral walls of the micromechanical component;
  f) releasing the micromechanical component from the mask and from the substrate.

It is understood that two distinct types of etch are obtained in the same etching chamber. It is immediately clear that the oblique etch of step e) can form a substantially oblique second surface and form several micromechanical components on the same substrate having a peripheral wall with a reduced contact surface. It can also be observed that, as a result of the protective layer provided only on the vertical walls, the oblique etch of step e) allows for a considerably more open angle and a substantially rectilinear direction of etching, which avoids being limited by the parameters of a Bosch deep reactive ion etching which, conversely, is used in step c) with its optimised vertical etching parameters.

In accordance with other advantageous variants of the invention:
  step c) is achieved by alternating an etching gas flow and a passivation gas flow in the etching chamber in order to form substantially vertical walls;
  step d) includes phase d1): oxidising the etch obtained in step c) to form the silicon oxide protective layer; and phase d2): directionally etching the protective layer in order to selectively remove only the part of the protective layer at the bottom of the etch made in step c);
  step e) is achieved by mixing the etching gas and the passivation gas in the etching chamber in order to form oblique walls;
  in step e), the continuous etching and passivation gas flows are pulsed to enhance the etch of the cavity bottom.

Moreover, the invention relates to a micromechanical component obtained from the method according to any of the preceding variants, wherein the component includes a silicon-based body whose peripheral wall includes a first substantially vertical surface and a second oblique surface thereby decreasing the contact surface of the peripheral wall.

Advantageously according to the invention, it is understood that the peripheral or internal vertical wall of the micromechanical component offers a reduced contact surface or, on insertion of a member along an internal wall of the micromechanical component, can provide improved tribological contact with another component.

In accordance with other advantageous variants of the invention:
  the micromechanical component further includes at least one cavity comprising an internal wall also including a first substantially vertical surface and a second substantially oblique surface;
  the micromechanical component forms all or part of an element in the movement or external parts of a timepiece.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

Figure 12:
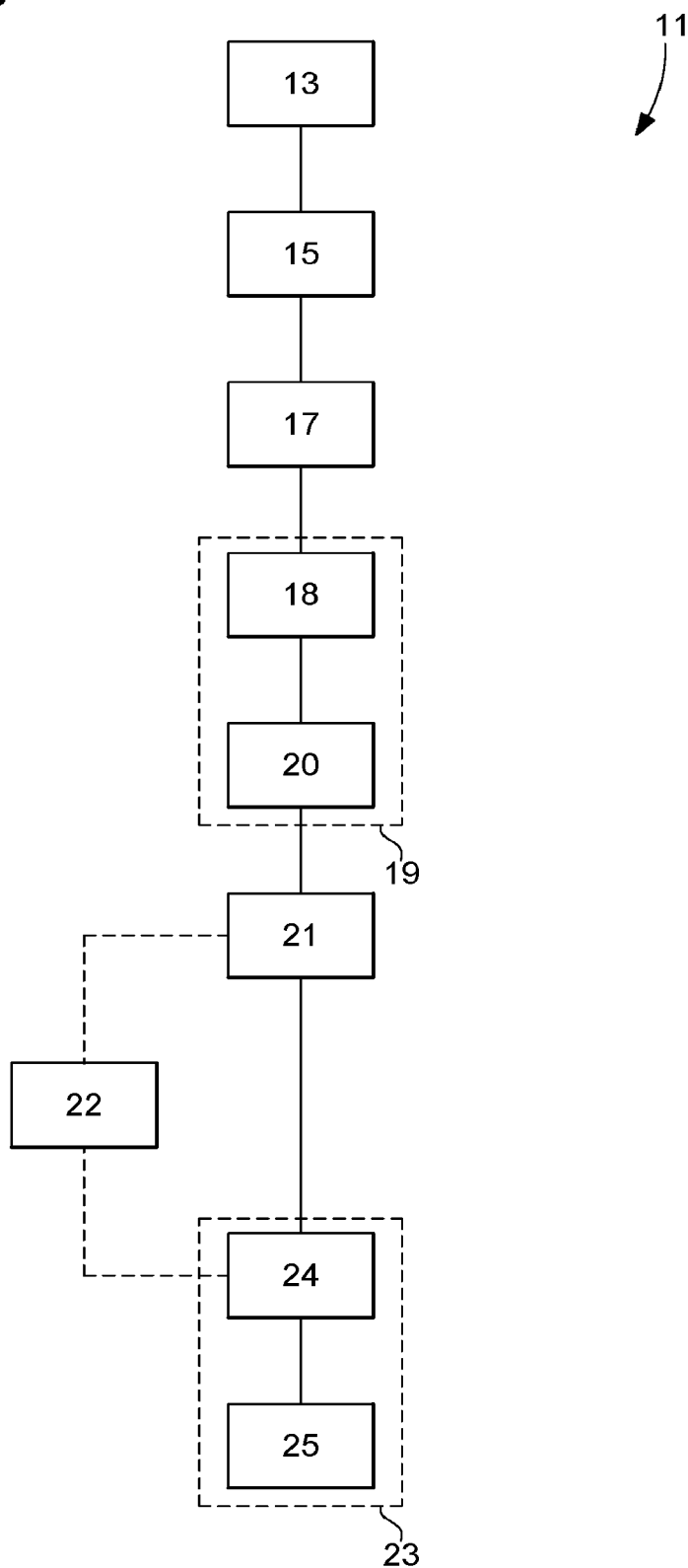
FIG. 12 is a flow diagram of the fabrication method according to the invention.

The invention relates to a method 11 for fabricating a silicon-based micromechanical component. As illustrated in FIG. 12, method 11 includes a first step 13 of taking a silicon-based substrate.

The term "silicon-based" means a material including single crystal silicon, doped single crystal silicon, polycrystalline silicon, doped polycrystalline silicon, porous silicon, silicon oxide, quartz, silica, silicon nitride or silicon carbide. Of course, when the silicon-based material is in crystalline phase, any crystalline orientation may be used.

Figure 1:
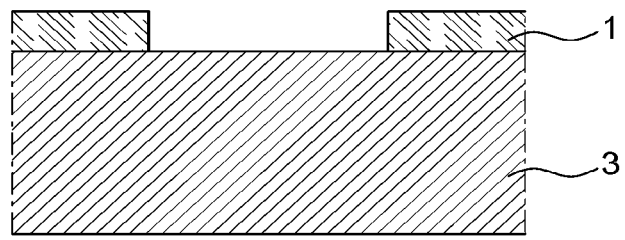
FIGS. 1 to 3 are diagrams intended to explain the "Bosch" deep reactive ion etching process used within the scope of the invention.
Figure 1:
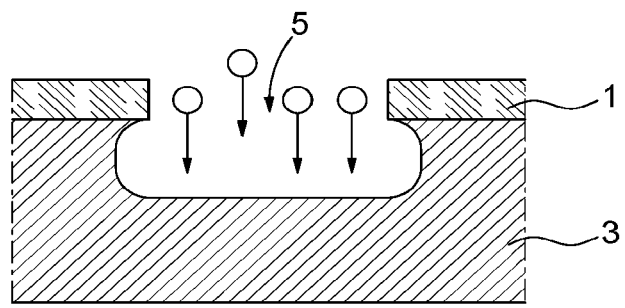
Figure 1:
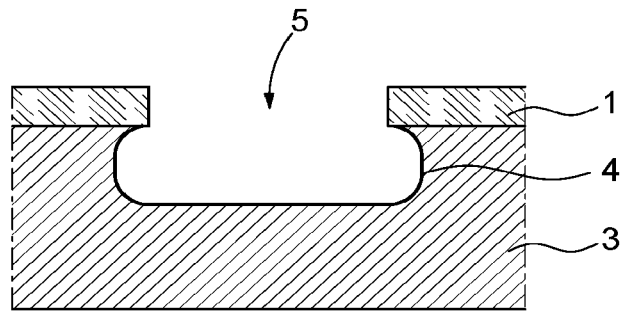
Figure 1:
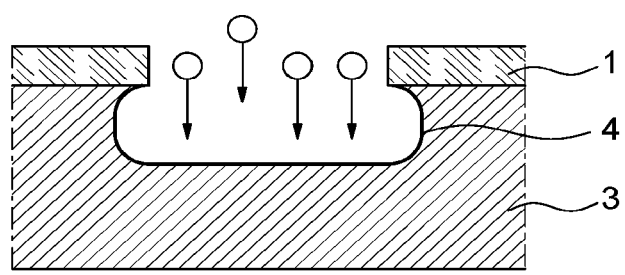
Figure 1:
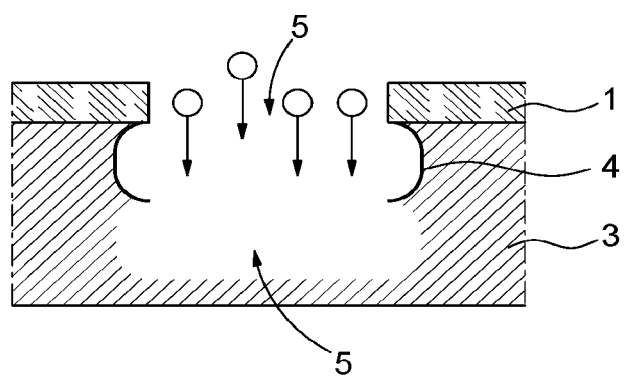
Figure 2:
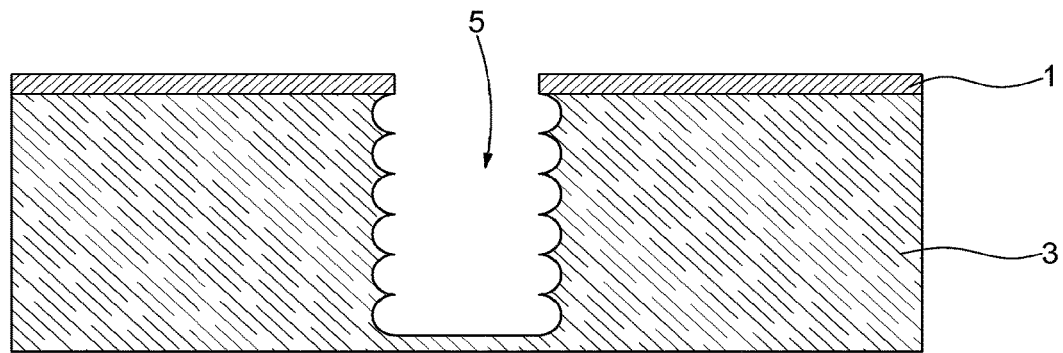
Figure 3:
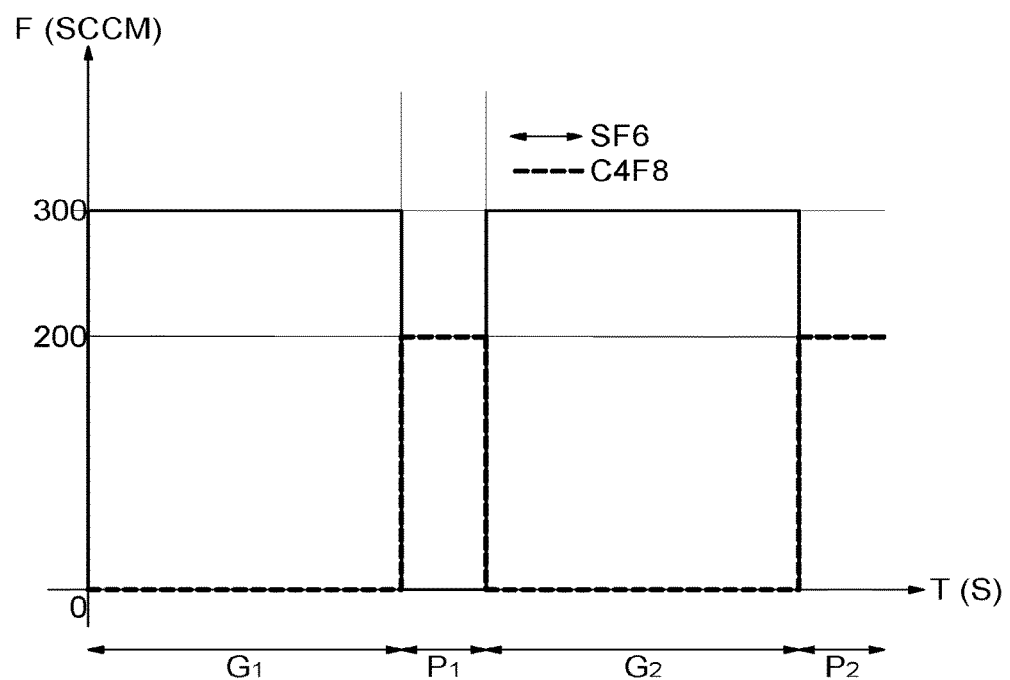
Figure 4:
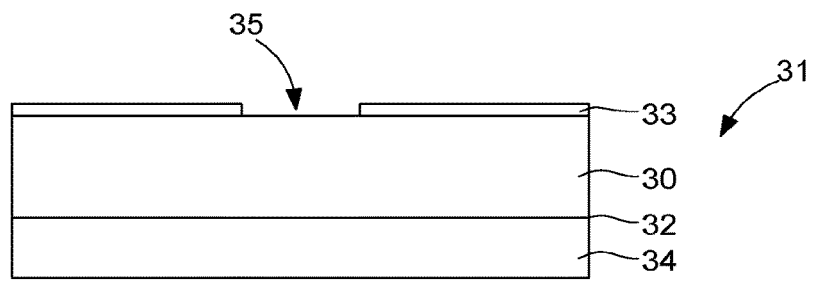
FIGS. 4 to 10 are views of steps of a method for fabricating a micromechanical component according to the invention.

Typically, as illustrated in FIG. 4, the silicon-based substrate 31 may be a silicon-on-insulator substrate (also known by the abbreviation "SOI") comprising an upper silicon layer 30 and a lower silicon layer 34 joined by an intermediate silicon oxide layer 32. However, alternatively, the substrate could comprise a silicon layer added to another type of base such as, for example, a metal base.

The method continues with step 15 of forming a mask 33 pierced with holes 35 on a horizontal portion of substrate 31. In the example of FIG. 4, mask 33 is formed on the upper portion of upper silicon layer 30. Mask 33 is formed from a material capable of withstanding the future etching steps of method 11. Thus, mask 33 may be formed from silicon nitride or from silicon oxide. In the example of FIG. 4, mask 33 is formed from silicon oxide.

Advantageously according to the invention, method 11 continues with a step 17 of etching, in an etching chamber, substantially vertical walls 36, in at least part of the thickness of substrate 31 from the pierced holes 35 in mask 33, in order to form peripheral or internal walls of the micromechanical component.

The substantially vertical etching step 17 is typically a "Bosch" deep reactive ion etching described above, i.e. alternating an etching gas flow and a passivation gas flow in an etching chamber so as to form substantially vertical walls 36.

Figure 5:
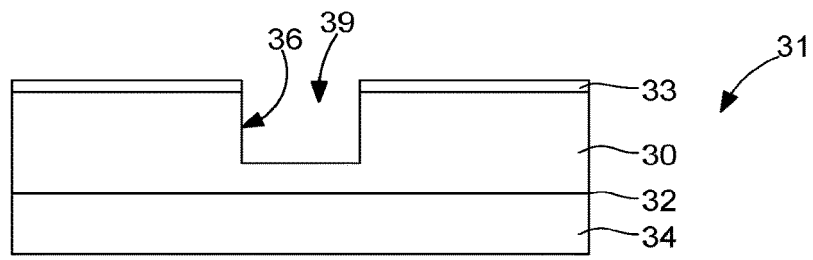

Indeed, step 17 allows for a substantially vertical etching direction relative to mask 33, as seen in FIG. 5. There is thus obtained an etch 39 whose section, visible in FIG. 5, is substantially in the form of a right-angled quadrilateral. Of course, depending on the shape of holes 35, the shape of the volume removed during the etching varies. Thus, a circular hole will give a cylindrical etch, and, a square hole, a cube or rectangular parallelepiped.

Figure 7:
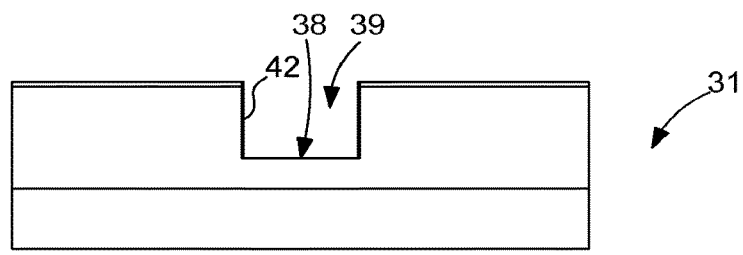

Method 11 continues with step 19 of forming a protective layer 42 on vertical walls 36, leaving the bottom 38 of etch 39 without any protective layer, as seen in FIG. 7.

Figure 6:
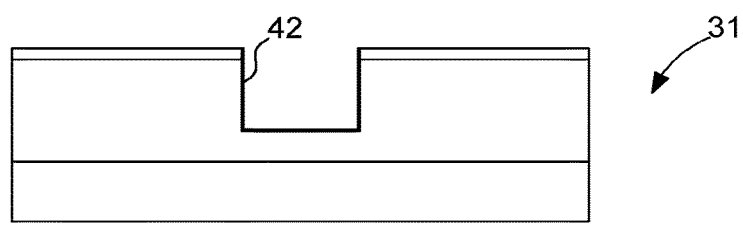

Preferably, protective layer 42 is formed of silicon oxide. Indeed, as seen in FIGS. 6 and 7, step 19 may then comprise a first phase 18 intended to oxidise the entire top of substrate 31, i.e. mask 33 (if made of silicon oxide), walls 36 and bottom 38 formed by etch 39, to form an added thickness on mask 33 and a thickness on vertical walls 36 and bottom 38 of etch 39, to form a protective layer 42 made of silicon oxide.

The second phase 20 could then consist in directionally etching protective layer 42 in order to selectively remove the horizontal silicon oxide surfaces from a part of mask 33 and from the entire part of protective layer 42 only on bottom 38 of etch 39 as seen in FIG. 7.

Method 11 may then continue with step 21 of etching, in the same etching chamber, but according to predetermined oblique walls 37, in the remaining thickness of substrate 31 from bottom 38 without any protective layer 42, in order to form oblique lower surfaces beneath the peripheral walls of the micromechanical component.

Oblique etching step 21 is not a "Bosch" deep reactive ion etching described above. Indeed, as a result of protective layer 42, step 21 allows for a much more open angle and a substantially rectilinear etching direction, which avoids being limited by the parameters of a "Bosch" deep reactive ion etching. Indeed, it is generally considered that, even by modifying the parameters of a "Bosch" deep reactive ion etch, the opening angle cannot exceed 10 degrees with a curved etching direction.

Advantageously according to the invention, step 21 is preferably achieved by mixing the $SF_6$ etching gas and the $C_4F_8$ passivation gas in the etching chamber in order to form oblique walls 37. More specifically, the continuous $SF_6$ etching and $C_4F_8$ passivation gas flows are pulsed to enhance the etch at the bottom of the cavity.

Figure 8:
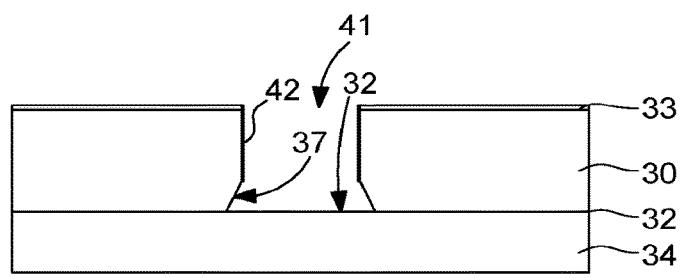

It is thus understood that step 21 allows for a much more open angle, typically around 45 degrees in the FIG. 8 example, instead of the maximum of 10 degrees obtained using a "Bosch" deep reactive ion etching with optimised parameter modification. Advantageously according to the invention, step 21 can thus give a precise opening angle without modifying the surfaces of vertical walls 36. The angle between vertical walls 36 and oblique walls 37 is highly reproducible and can advantageously be comprised between substantially 0° and substantially 45°. As explained above, it is particularly the possibility of etching at an angle of more than 10° which is remarkable compared to a "Bosch" deep reactive ion etching. Preferably, the angle according to the invention between vertical walls 36 and oblique walls 37 is greater than 10° and less than 45°, and even more preferably, greater than 20° and less than 40°.

Further, the continuous flow pulsation allows for improved etching directivity, and can even provide substantially truncated cone-shaped walls and not spherical walls (sometimes called isotropic etches) as with a wet etch or a dry etch, for example, using only $SF_6$ gas.

To obtain the shape of walls 37 in FIG. 8, it is possible, for example, to apply a sequence that may include a first phase with a flow of $SF_6$ mixed with a flow of $C_4F_8$ for a first duration, followed by a second phase with an increased flow of $SF_6$ mixed with a reduced flow of $C_4F_8$ for a second duration, and then the first and second phases again and so on.

By way of example, this sequence could include a first phase with a flow of $SF_6$ at 500 sccm mixed with a flow of $C_4F_8$ at 150 sccm for 1.2 second, followed by a second phase shown with a flow of $SF_6$ at 600 sccm mixed with a flow of $C_4F_8$ at 100 sccm for 0.8 second, followed by a third phase again with, a flow of $SF_6$ at 500 sccm mixed with a flow of $C_4F_8$ at 150 sccm for 1.2 second and followed by a fourth phase with a flow of $SF_6$ at 600 sccm mixed with a flow of $C_4F_8$ at 100 sccm for 0.8 second and so on.

It is thus noted that the continuous flow pulsation enhances the etching at the bottom level of the cavity which will gradually widen, during step 21, the possible opening of etch 41 as a function of its depth and, incidentally, a wider etch opening 41 in the lower portion of upper layer 30 until there is obtained an etch opening 41 wider than hole 35 in the mask 33 or than the section of the bottom 38 of etch 39 at the start of step 21, as seen in the change from FIG. 7 to FIG. 8.

Figure 9:
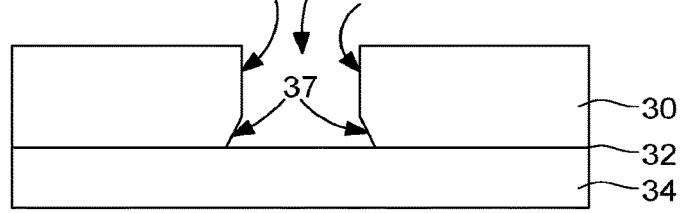

Finally, method 11 finishes with step 23 of releasing the micromechanical component from substrate 31 and from mask 33. More specifically, in the example shown in FIGS. 9 and 12, step 23 may include a deoxidation phase 24 to remove the silicon oxide mask 33 and, possibly, all or part of the intermediate silicon oxide layer 32, and then a release phase 25 from substrate 31 with the aid, for example, of a selective chemical etch.

The method 11 illustrated in single lines in FIG. 12 allows for two different types of etching in the same etching chamber. It can also be observed that the oblique etching of step 21 allows for a considerably more open angle and a substantially rectilinear direction of etching, which avoids being limited by the parameters of a "Bosch" deep reactive ion etching and using the latter in step 17 with optimised vertical etching parameters.

Figure 11:
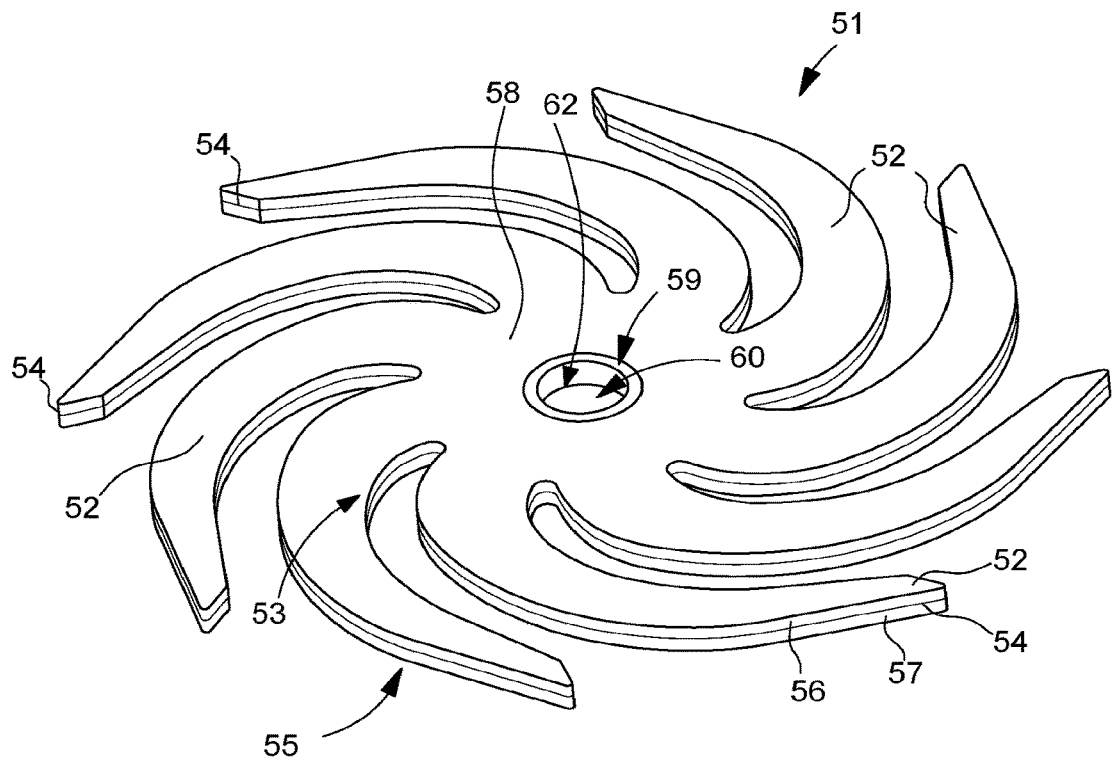
FIG. 11 is a view of a micromechanical component according to the invention.

Advantageously according to the invention, the micromechanical component 51 that forms a wheel in the example of FIG. 11 comprises a peripheral wall 54 forming a toothing which includes a reduced contact surface.

Figure 10:
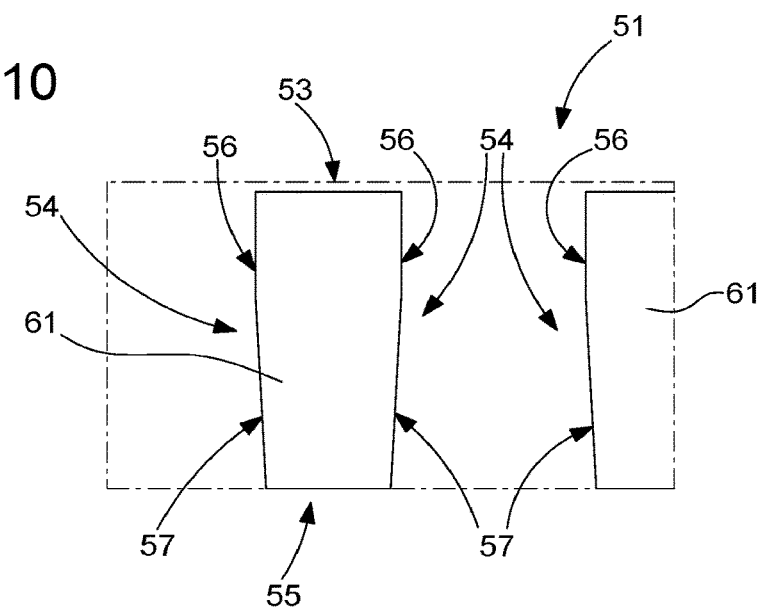

As seen more clearly in FIG. 10, which is an enlarged view of a portion of component 51, micromechanical component 51 thus includes a silicon-based body 61 whose peripheral wall 54 borders a horizontal upper surface 53 and a horizontal lower surface 55 and includes a first substantially vertical surface 56 and a second oblique surface 57.

It is thus clear that the second oblique, substantially rectilinear surface 57 provides peripheral wall 54 forming a toothing, with a decreased contact surface allowing for improved tribological contact with another component. It is also clear that inner wall of a hole 60 may also more easily receive a member.

Of course, the present invention is not limited to the illustrated example but is capable of various variants and modifications which will appear to those skilled in the art. In particular, an oxidizing step 22, intended to smooth the silicon walls, may be performed between steps 21 and 23.

Further, a metal or metallic alloy part could be deposited in etch 41, in an optional step between phases 24 and 25, so as to form a sleeve 59 in the hole 60 of micromechanical component 51, as illustrated in FIG. 11.

This metal or metallic alloy part could even overlap over etch 41 to form an additional functional level of composite micromechanical component 51 formed only of metal.

Thus, after step 24 of deoxidizing substrate 31, method 11 could continue with a step of selectively filling a cavity formed during etches 17 and 21, with a metal or metallic alloy in order to provide an attachment to the micromechanical component.

By way of example, lower layer 34 of substrate 31 could then preferably be highly doped and used as the direct or indirect base for filling by electroplating. Thus a first phase could be intended to form a mould, for example made of photosensitive resin, on top of mask 33 and in a part of etch 41. A second phase could consist in electroplating a metallic part, from lower layer 34, at least between the micromechanical silicon component and a part of the mould formed in etch 41. Finally, a third phase could consist in removing the mould formed in the first phase. The method would finish with phase 25 of releasing the composite micromechanical component from substrate 31 by a selective chemical etch.

Advantageously according to the invention, it is thus understood that galvanic deposition 59 is, because of the shapes of first substantially vertical surface 56 and a second oblique surface 57, more difficult to remove than an essentially vertical surface and enjoys improved shearing resistance.

Further, said at least one hole 60, which is at least partially filled with a metal or a metal alloy 59 can provide an attachment to composite micromechanical component 51. Thus, in the example of FIG. 11, hole 60 could leave a cylindrical recess 62 allowing composite micromechanical component 51 to be driven onto an arbor with good mechanical strength when the metal or metal alloy part 59 expands as a result of the shapes of peripheral wall 54.

Finally, micromechanical component 51 is not limited to the application of a wheel as seen in FIG. 11. Thus, micromechanical component 51 can form all or part of an element in the movement or external parts of a timepiece.

By way of non-limiting example, micromechanical component 51 may thus form all or part of a balance spring, an impulse pin, a balance wheel, an arbor, a roller, a pallets such as a pallet-staff, pallet-lever, pallet-fork, pallet-stone or guard pin, a wheel set such as a wheel, arbor or pinion, a bar, a plate, an oscillating weight, a winding stem, a bearing, a case such as the case middle or horns, a dial, a flange, a bezel, a push-piece, a crown, a case back, a hand, a bracelet such as a link, a decoration, an applique, a crystal, a clasp, a dial foot, a setting stem or a push-piece shaft.

What is claimed is:

1. A method for fabricating a silicon-based micromechanical component comprising the following steps:
   a) taking a silicon-based substrate;
   b) forming a mask pierced with holes on a horizontal portion of the substrate;
   c) etching, in an etching chamber, substantially vertical walls, in a part of the thickness of the substrate, from holes of the mask, in order to form peripheral walls of the micromechanical component;
   d) forming a protective layer on the vertical walls, leaving the bottom of the etch made in step c) without any protective layer;
   e) etching, in the etching chamber, predetermined oblique walls, in the remaining thickness of the substrate from the bottom, which has no protective layer, in order to form oblique lower surfaces beneath the peripheral walls of the micromechanical component;
   f) releasing the micromechanical component from the mask and from the substrate.

2. The method according to claim 1, wherein step c) is achieved by alternating an etching gas flow and a passivation gas flow in the etching chamber in order to form substantially vertical walls.

3. The method according to claim 1, wherein step d) comprises the following phases:
   d1) oxidizing the etch obtained in step c) to form the protective silicon oxide layer;
   d2) directionally etching the protective layer in order to selectively remove only the part of the protective layer on the bottom of the etch made in step c).

4. The method according to claim 1, wherein step e) is achieved by mixing an etching gas and a passivation gas in the etching chamber in order to form oblique walls.

5. The method according to claim 4, wherein, in step e), the continuous etching and passivation gas flows are pulsed to enhance the etch at the bottom level of the etch.

6. A micromechanical component obtained from the method according to claim 1, wherein the micromechanical component comprises a silicon-based body whose peripheral wall includes a first substantially vertical surface and a second oblique surface thereby decreasing the contact surface of the peripheral wall.

7. The micromechanical component according to claim 6, wherein the micromechanical component further comprises at least one hole (60) comprising an internal wall also including a first substantially vertical surface and a second substantially oblique surface.

8. The micromechanical component according to claim 6, wherein the micromechanical component forms all or part of an element of the movement or external parts of a timepiece.

* * * * *